US006281709B1

(12) United States Patent
Seyyedy

(10) Patent No.: US 6,281,709 B1
(45) Date of Patent: Aug. 28, 2001

(54) FUSE OPTION FOR MULTIPLE LOGIC FAMILIES ON THE SAME DIE

(75) Inventor: Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,699

(22) Filed: Aug. 31, 1999

(51) Int. Cl.$^7$ .............................................. H03K 19/0185
(52) U.S. Cl. ........................ 326/87; 326/86; 326/81; 327/525
(58) Field of Search .................. 326/81–83, 86, 326/87, 49, 50, 112, 119, 37, 10, 13, 14; 327/525

(56) References Cited

U.S. PATENT DOCUMENTS

| | | |
|---|---|---|
| 4,223,277 | 9/1980 | Taylor et al. ........................ 330/264 |
| 4,959,564 | 9/1990 | Steele ................................. 307/465 |
| 5,099,148 | 3/1992 | McClure et al. ..................... 307/443 |
| 5,107,230 | 4/1992 | King ..................................... 333/32 |
| 5,128,560 | 7/1992 | Chern et al. ........................ 307/475 |
| 5,208,492 * | 5/1993 | Masumoto et al. .................. 326/83 |
| 5,257,225 | 10/1993 | Lee ..................................... 365/185 |
| 5,281,868 | 1/1994 | Morgan .............................. 307/441 |
| 5,282,158 | 1/1994 | Lee ....................................... 365/96 |
| 5,324,681 | 6/1994 | Lowrey et al. ...................... 437/52 |
| 5,331,196 | 7/1994 | Lowrey et al. .................... 257/529 |
| 5,345,110 | 9/1994 | Renfro ............................. 307/272.3 |
| 5,361,003 | 11/1994 | Roberts .............................. 326/21 |
| 5,373,199 | 12/1994 | Shichinohe et al. ............... 327/328 |
| 5,379,250 | 1/1995 | Harshfield ......................... 365/105 |
| 5,514,980 | 5/1996 | Pilling et al. ........................ 326/38 |
| 5,526,317 | 6/1996 | McClure ......................... 365/225.7 |
| 5,530,379 * | 6/1996 | Konishi et al. ...................... 326/86 |
| 5,566,107 | 10/1996 | Gilliam .............................. 365/200 |
| 5,589,783 * | 12/1996 | McClure ............................. 326/81 |
| 5,703,496 | 12/1997 | Sabin ................................... 326/27 |
| 5,712,588 | 1/1998 | Choi et al. ......................... 327/525 |
| 5,726,585 | 3/1998 | Kim ..................................... 376/38 |
| 5,748,031 | 5/1998 | Best ................................... 327/525 |
| 5,821,783 | 10/1998 | Torimaru et al. .................. 327/108 |
| 6,040,714 * | 3/2000 | Klein ................................... 326/86 |

OTHER PUBLICATIONS

"Interface Standard for Nominal 3V/3.3V Supply Digital Integrated Circuits", *JEDEC Standard*, Electronic Industries Association, 1–4, (Jun. 1994).

* cited by examiner

Primary Examiner—Michael Tokar
Assistant Examiner—Don Phu Le
(74) Attorney, Agent, or Firm—Schwegman, Lundberg, Woessner & Kluth, P.A.

(57) ABSTRACT

A chip's interface is selected by using a fuse option coupled between integrated circuitry on the chip and logic circuitry. Fuse options correspond to antifuses or fuses. In one embodiment, a plurality of fuse options are manufactured in an integrated circuit such that a fuse option is coupled between integrated circuitry on the chip and separate and complete logic circuitry for different logic types used to interface a chip. In another embodiment, only one type of logic circuitry is manufactured on a chip, such that the logic circuitry has both a pull-up and pull-down transistor. A fuse is coupled with a pull-up control circuit of the logic circuitry. When the fuse is blown, the output circuit corresponds to GTL-terminated logic circuitry, using only the pull-down transistor. In a further embodiment, an antifuse is coupled with the pull-up control circuit. When the antifuse is programmed, default GTL-terminated logic is converted to TTL family output logic, or another logic which uses both pull-up and pull-down transistors in its logic circuitry.

29 Claims, 4 Drawing Sheets

FUSE OPTION FOR MULTIPLE LOGIC FAMILIES ON THE SAME DIE

FIELD OF THE INVENTION

The present invention relates to output devices for logic circuitry, and in particular to the modification of such devices for use with multiple logic families.

BACKGROUND OF THE INVENTION

There are several families of semiconductor logic circuitry, each of which is defined at least partly by different voltage levels that they accept as input and provide as output. In addition, logic families may also specify how fast the logic needs to operate. In general, for semiconductor memories, such as Dynamic Random Access Memories, DRAMs, operating voltages are getting lower. Several factors are contributing to this lowering of voltage levels. Line widths are decreasing in size at the same time that the speeds of DRAM devices and other semiconductor devices are increasing. It is difficult to sink current into devices, with such small geometries, in order to change the voltage level. A change in voltage from high to low corresponds to a change in logic levels from or to a one or a zero. As the frequency of operation of such devices increases, such changes occur faster.

In order to change faster, the difference between the high and low voltages tends to decrease with each new logic family introduced. One such family is called Transistor-transistor Logic (TTL). The next iteration of logic produced in the TTL family is called Low Voltage TTL (LVTTL). Yet a further iteration of logic has produced the family known as Gunning Transceiver Logic (GTL). In the GTL family, more than just the voltage level has changed in order to increase the speed of operation. The output circuit for devices formed with such logic has also changed in order to obtain the increase in speed.

DRAMs for computers and other electronic devices are manufactured in very high volumes. Electronic device manufacturers design their devices to interface with such memories at various logic levels. Currently, memories are modified during their manufacturing process to provide custom input and output levels to accommodate each device's logic level requirement. This can result in differences early in the manufacturing process for memories intended for different devices. There is a need for reducing differences in the manufacturing process for each memory device with a different logic level interface. There is a further need to apply the process modifications toward the end of the manufacturing process of memory devices to better correlate manufacturing output to demand, which may change quickly. There is a further need to minimize the amount of space on a chip to accommodate input and output circuitry.

Some of the circuitry currently formed on a DRAM at the same time as the memory is being formed is shown in prior art FIGS. 1 and 2. In FIG. 1, LVTTL logic and TTL logic both use a pair of transistors or sets of transistors in parallel—a pull-up transistor 110 to pull an output line 114 up to the supply voltage 116 and a pull-down transistor 112 to pull an output line 114 down to ground depending on the logic level desired. These are very big transistors or sets of parallel transistors 110 and 112, and require high current to switch faster. In fact, at switching frequencies above 100 MHZ, they can not switch fast enough. The pull-up transistor 110 and the pull-down transistor 112 are coupled respectively to a pull-up control 118 and pull-down control 120, which are connected in parallel with integrated circuitry on a chip, such as a memory array 122 shown in FIG. 1.

In comparison, as shown in FIG. 2, the output circuit for GTL-terminated logic uses a single transistor 224 to drive an output line 226. The transistor 224 is a pull-down transistor 224, driven by a pull-down control 228. The GTL logic circuit is coupled to integrated circuitry on a chip, such as a memory array 222 shown in FIG. 2. The GTL logic circuit requires only about one-half the current of a LVTTL or TTL output driver and hence can switch much faster.

Small Swing Transistor Logic (SSTL) logic provides for fast switching by reducing the difference between high and low output voltage levels by reducing the width of the pull-up and pull-down transistors. By decreasing the overall swing in output voltage, faster switching times are obtained.

There is a need to provide the various output levels for semiconductor devices in a manner that makes them easy to manufacture. There is a need to provide modifications of such devices late in the process of making them to ensure that the devices manufactured meet the demand for the various output levels.

SUMMARY OF THE INVENTION

Output drivers are fabricated such that a fuse option allows for selection of a desired output logic for a chip. An antifuse or a fuse, such as a laser fuse, is used for the fuse option.

In a first embodiment, Transistor-transistor Logic (TTL) family logic circuitry is manufactured on a chip for the output logic circuitry. Low Voltage TTL (LVTTL) and TTL are in the same family of logic circuitry. Thus, both require manufacture of a pull-up transistor or transistors paired with a pull-down transistor or transistors to operate as an output driver. TTL is the most common logic output family for memory chips, such as dynamic random access memory (DRAM) chips. The fuse option serves to couple the pull-up transistor either to a low reference voltage or a level translated data signal from memory chip, such that it can be activated/deactivated according to the desired output logic for a chip. The TTL default logic is easily switched to Gunning Transceiver Logic (GTL)-terminated logic by programming the fuse to turn off the pull-up transistor.

In an alternate embodiment, an antifuse is coupled to the pull-up transistor, so that the default logic of the chip is GTL-terminated. By programming the antifuse to the "on" state, the output logic of the chip is switched to TTL family logic late in the manufacturing process of DRAM or other chips. In addition, since some of the same circuitry is used in both modes, chip space is conserved.

Small Signal Transistor Logic (SSTL) is obtained by reducing the channel width of parallel coupled pull-up and pull-down transistors by programming multiple fuses, each coupled to a different pull-up and/or pull-down transistor. In this manner, much circuitry between the various optional logic output circuits is shared.

In a further embodiment, chips are manufactured such that output logic circuitry for each output logic desired is separate and complete on a chip. Logic families include TTL, SSTL, High Speed Transistor Logic (HSTL), GTL and others. The desired output logic for a chip is then selected by way of a fuse option. In this embodiment, a fuse option is coupled to either activate or shut down output circuitry as desired. After manufacturing of the chip is substantially completed, the desired output logic for a chip is selected by either blowing each fuse coupled to all but the desired output logic circuitry or programming only the antifuse coupled to the desired output logic circuitry.

This invention allows for easy selection of a chip's output logic during late stages of manufacture. This is particularly advantageous today because many different types of logic families are evolving. Since the output logic of a chip must be compatible with the input logic of an adjacent chip to properly interface the two chips, it is desirable to be able to select the output logic of a chip once the input logic of an adjacent chip is known, without requiring special manufacture or replacement of the chip having the non-compatible output logic. Valuable chip space is also conserved when manufacturing a chip in accordance with the first embodiment of the invention. Both TTL family, SSTL and GTL-terminated logic circuitry may be placed on a chip, requiring substantially only the chip space necessary to construct the TTL family logic circuitry.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds digits corresponding to the figure number, with the exception that the same components may appear in multiple figures. Signals and connections may be referred to by the same number or label, and the actual meaning should be clear from the context of use.

A fuse option is fabricated in a semiconductor integrated circuit (IC) so that an interface for the semiconductor chip can be selected subsequent to fabrication of most components. Chip interfaces need to be switched in order to be compatible with operating conditions of other IC component chips. Manufacturers of chips often make their chip logic different than that of other manufacturers component chips. Component chips from different manufacturers are often coupled together in an IC. Due to the various types of logic selected by chip manufacturers, it is highly advantageous to fabricate a chip so that its logic can be adapted accordingly.

A fabricated default logic is changed or selected by executing the fuse option. The fuse option is usually either an antifuse or a fuse or any other type of element which can be used to modify current paths. An antifuse operates as an open circuit when fabricated. By applying a large voltage to the antifuse structure, the antifuse becomes "programmed." A programmed antifuse, fabricated as well known to one skilled in the art, operates as a conductor or link in a closed circuit, allowing current to flow through that part of the circuit. In comparison, a fuse operates as a link in a closed circuit when fabricated. The fuse is fabricated and selectively melted by methods well known to one skilled in the art, such as by an electric current or laser. Once the fuse is melted, it operates as an open circuit.

Figure 1:
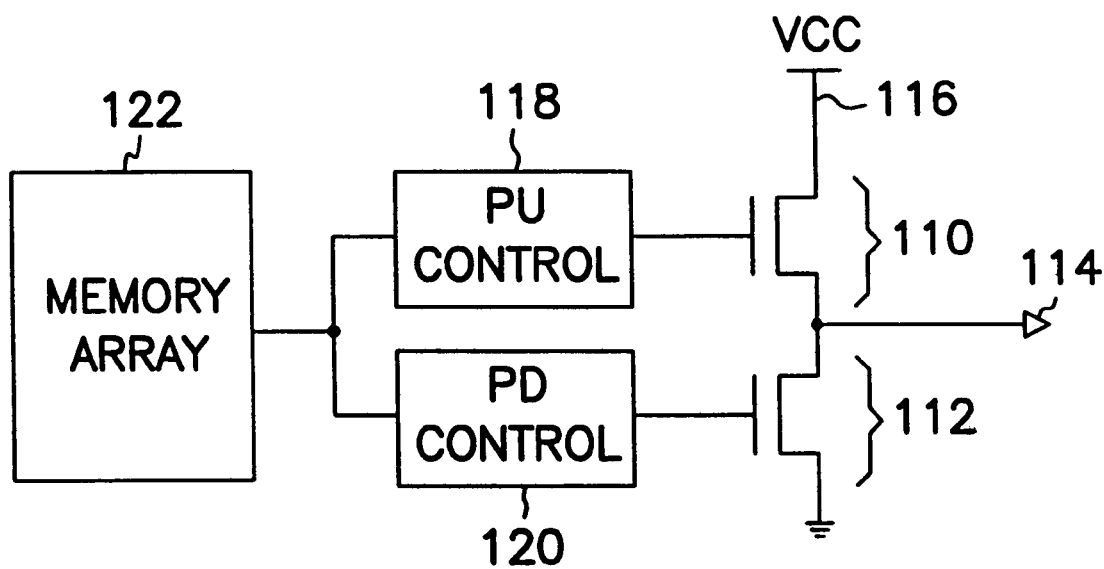
FIG. 1 is a schematic representation of a prior art output logic circuit.
Figure 2:
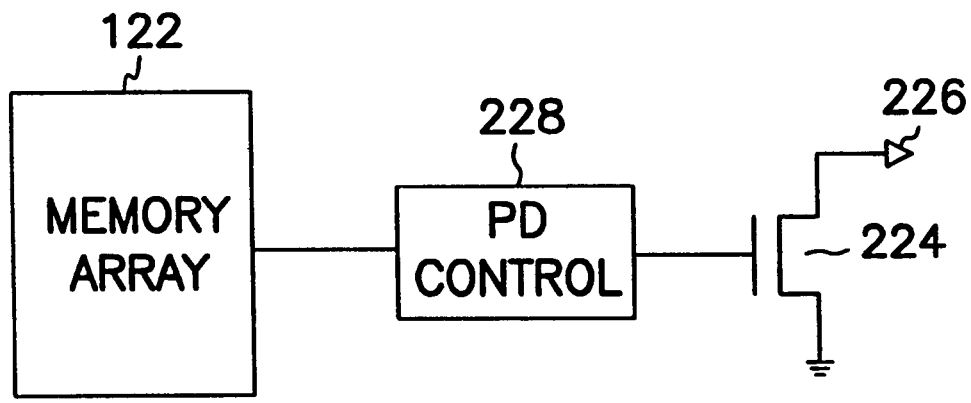
FIG. 2 is a schematic representation of a prior art GTL terminated output logic circuit.
Figure 3:
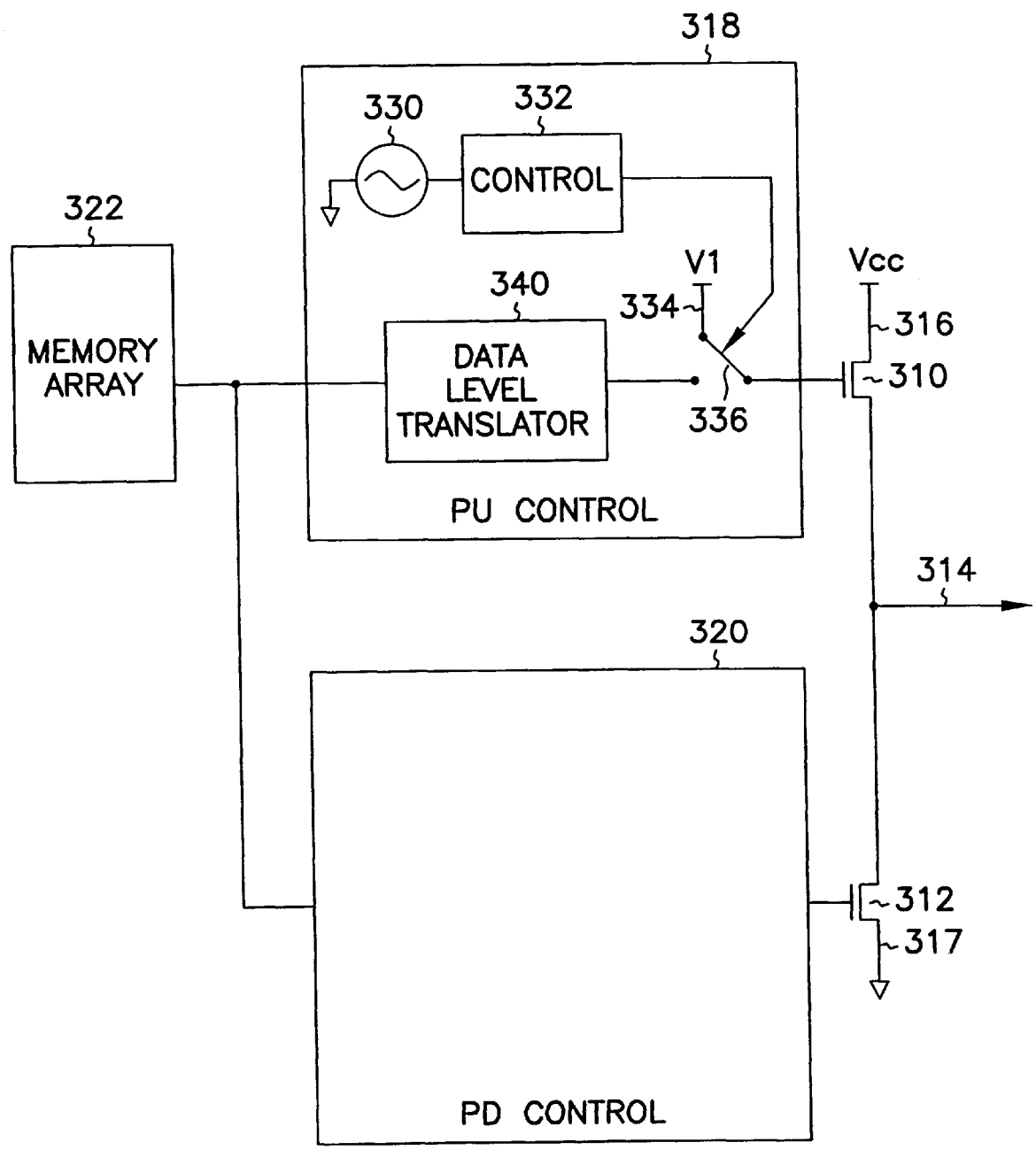
FIG. 3 is a block schematic representation of an output logic circuit, having a fuse option in accordance with the present invention.

In one embodiment, as shown in FIG. 3, a memory array 322 such as a DRAM is coupled to a pull-up controller 318 and a pull-down controller 320. The controllers 318 and 320 are respectively coupled to a pull-up transistor 310 and a pull-down transistor 312. The pull-up and pull-down transistors are coupled in series between a reference voltage Vcc at 316 and a lower reference, commonly ground at 317. An output signal on line 314 is driven between the pull-up and pull-down transistors. A fuse option 330 is provided within the pull-up control 318 with one side coupled to a reference voltage. The other side is coupled to a switch controller 332 which controls a switch 336. In a first embodiment, the fuse is an antifuse, and when blown, conducts. In a second embodiment, the fuse is conductive until blown. In either case, it is operatively coupled to cause the switch controller to place the switch in one of two positions. In a first position, it couples a first voltage V1 at 334 to a gate or gates of the pull-up transistor 310, causing it to be off. In a second position, it is coupled to a translated voltage representative of data from memory array 322. A data level translator 340 provides this voltage from sense amplifiers of memory array 322 at a level consistent with that needed to switch pull-up transistor 310.

The fuse option 330 is placed on a chip manufactured with components of Transistor-transistor (TTL) family output logic circuitry (either TTL or LVTTL output logic), namely sets of pull-up transistors 310 paired with sets of pull-down transistors 312. When the fuse is in a state to cause data from the memory array to control the pull-up transistor, TTL or LVTTL logic levels are provided at output 314. When the fuse couples the gate or gates of pull-up transistor 310 to a low voltage, preferably negative to ensure that transistor 310 is off, Gunning Transceiver Logic (GTL) logic levels are provided, using only the pull-down control circuitry 320 coupled to a pull-down transistor 312 for sending a chip's output through an output line 314 to another chip.

Figure 4:
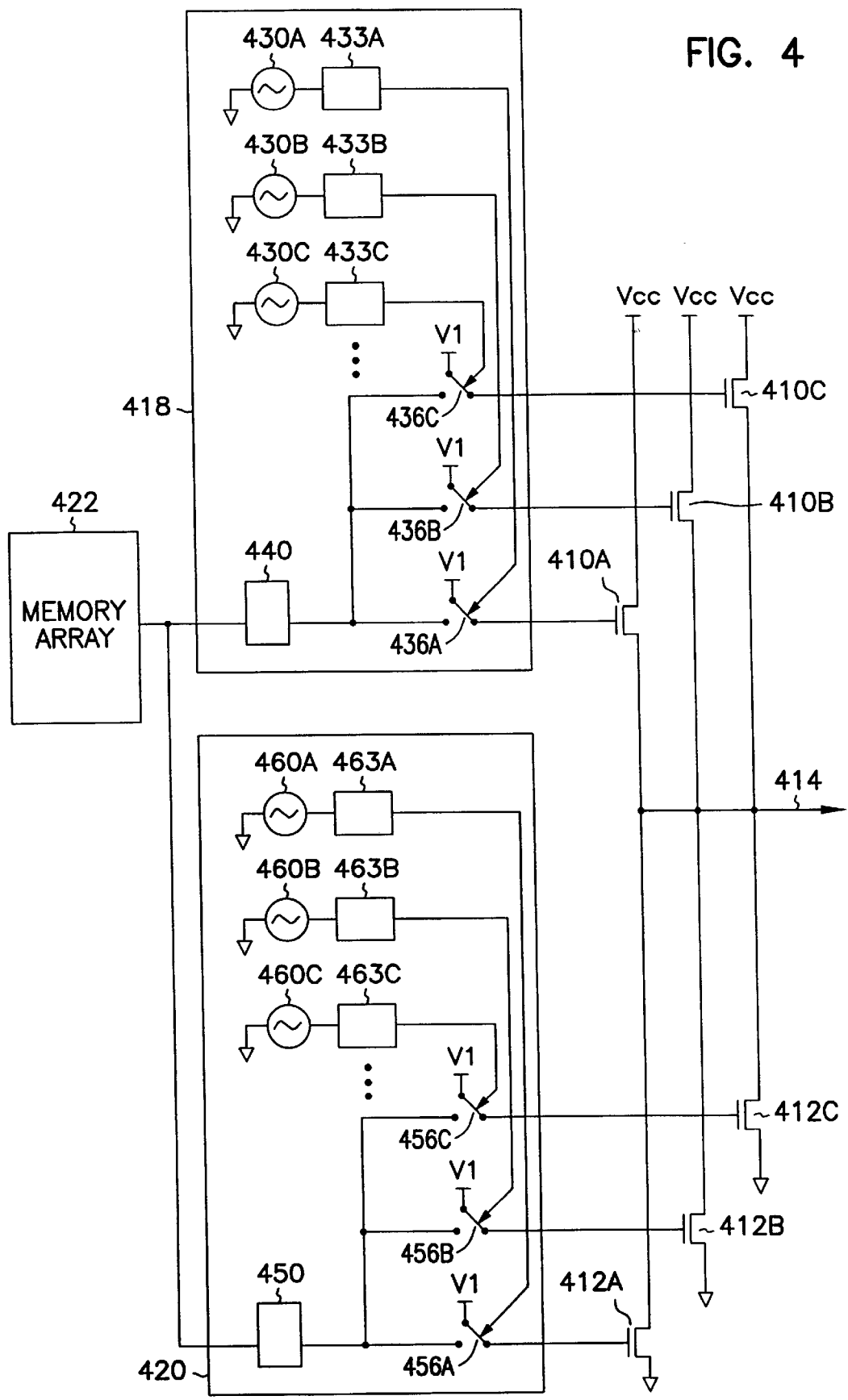
FIG. 4 is a block schematic representation of a further output logic circuit having multiple fuse options to provide multiple desired logic level outputs.

SSTL logic levels may also be provided by reducing the width of the pull-up and pull-down transistors. This can be done by either designing the width, or by trimming some of the multiple parallel transistors, or by provide yet further fuse options on some of the pull-up and pull-down transistors so that they can be programmed late in the manufacturing process. As shown in FIG. 4, each gate of parallel pull-up and pull-down transistors are controllably coupled to either a desired voltage reference level by use of a fuse option for each such gate, or, to the translated voltage level from the memory array. To provide TTL logic levels, each of the transistors is coupled to the translated data levels. To provide SSTL levels, a sufficient number of transistors are so connected to provide the proper SSTL levels. Again, the fuses may be programmed at a late stage in the manufacturing process so that there is less lead time required to select which logic level to produce. Of course, all the pull transistors are shut off by fuse to provide GTL levels.

The following levels are specified for SSTL logic. From an input reference voltage of about 1.5 volts, an input level of 0.2 volts higher causes the output to rise 0.8 volts above a termination voltage, while an input level of 0.3 volts lower than the reference drives the output to 0.8 volts below the termination voltage. The termination voltage is specified as 1.5 volts plus or minus 0.05 volts.

For LVTTL logic, the minimum high and maximum low output voltages are 2.4 and 0.4 volts respectively with maximum low and minimum high input voltages of 0.8 and 2.0 volts.

In one embodiment, a chip is manufactured having the capabilities of providing an output interface corresponding to either GTL or TTL family logic. However, both logic circuits do not need to be separately and completely manufactured on a chip, which undesirably consumes valuable chip space. This embodiment is also applicable to converting between other output logic when the components of the output logic circuitry allow such easy conversions, as in the example with TTL/GTL conversions. For example, conversions between Center-Tapped-Terminated (CTT)-terminated, GTL-unterminated, or High Speed Transceiver Logic (HSTL)-terminated and GTL-terminated families are also facilitated using this invention. Logic circuitry for each of CTT-terminated, GTL-unterminated, and HSTL-terminated families utilizes a paired pull-up transistor and pull-down transistor for the output driver, as does logic circuitry for TTL family logic. Thus, such logic is easily switched to/from GTL-terminated logic in accordance with the invention by deactivating/activating the pull-up transistor, respectively, with a fuse option.

In FIG. 4, a further embodiment provides selection between both TTL logic families, SSTL and GTL logic. A memory array 422 such as a DRAM is coupled to a pull-up controller 418 and a pull-down controller 420. The controllers 418 and 420 are respectively coupled to a series of parallel coupled pull-up transistors 410A, 410B, and 410C and a series of parallel coupled pull-down transistors 412A, 412B, and 412C. The pull-up and pull-down transistors are coupled in series between a reference voltage Vcc and a lower reference, commonly ground. While only three transistors are shown in each set, they represent as many as desired to obtain proper channel widths for desired logic family implementations. An output signal on line 414 is driven between the pull-up and pull-down transistors. A series of fuse options 430A, 430B, and 430C are coupled to a series of switch controllers 433A, 433B and 433C which operate to control a series of switches 436A, 436B and 436C. In a first embodiment, the fuses are antifuses, and when blown, conduct. In a second embodiment, the fuses are conductive until blown. In either case, they cause the switch controllers to place the switches in one of two positions. In a first position, they couple a first voltage V1 to a gate or gates of the pull-up transistors 410A–C, causing selected ones to be off. In a second position, they are selectively coupled to a translated voltage representative of data from memory array 422. A data level translator 440 provides this voltage at a level consistent with that needed to switch pull-up transistors 410A–C.

The circuitry of controller 418 is essentially duplicated in pull-down controller 420, comprising fuses 460A, 460B, and 460C, switch controller 463A, 463B and 463C, switches 456A, 456B, and 456C, pull-down transistors 412A, 412B and 412C and level translator 450 coupled to memory array 422. Programming of the fuses late in the manufacturing process in FIG. 4 provides the ability to obtain multiple logic level outputs at output 414. By leaving all the pull-up and pull-down transistors active, TTL levels are provided. Each of the transistors may be selected of varying sizes to also obtain SSTL levels by turning off selected pull-up and pull-down transistors. Further, all the pull-up transistors may be turned off by being held at a low reference voltage, preferably below zero to obtain GTL logic levels at the output 414. This embodiment has great flexibility and significant sharing of output driver logic, such as the level translators and further upstream logic, such as output buffer latches and other logic control circuitry.

Figure 5:
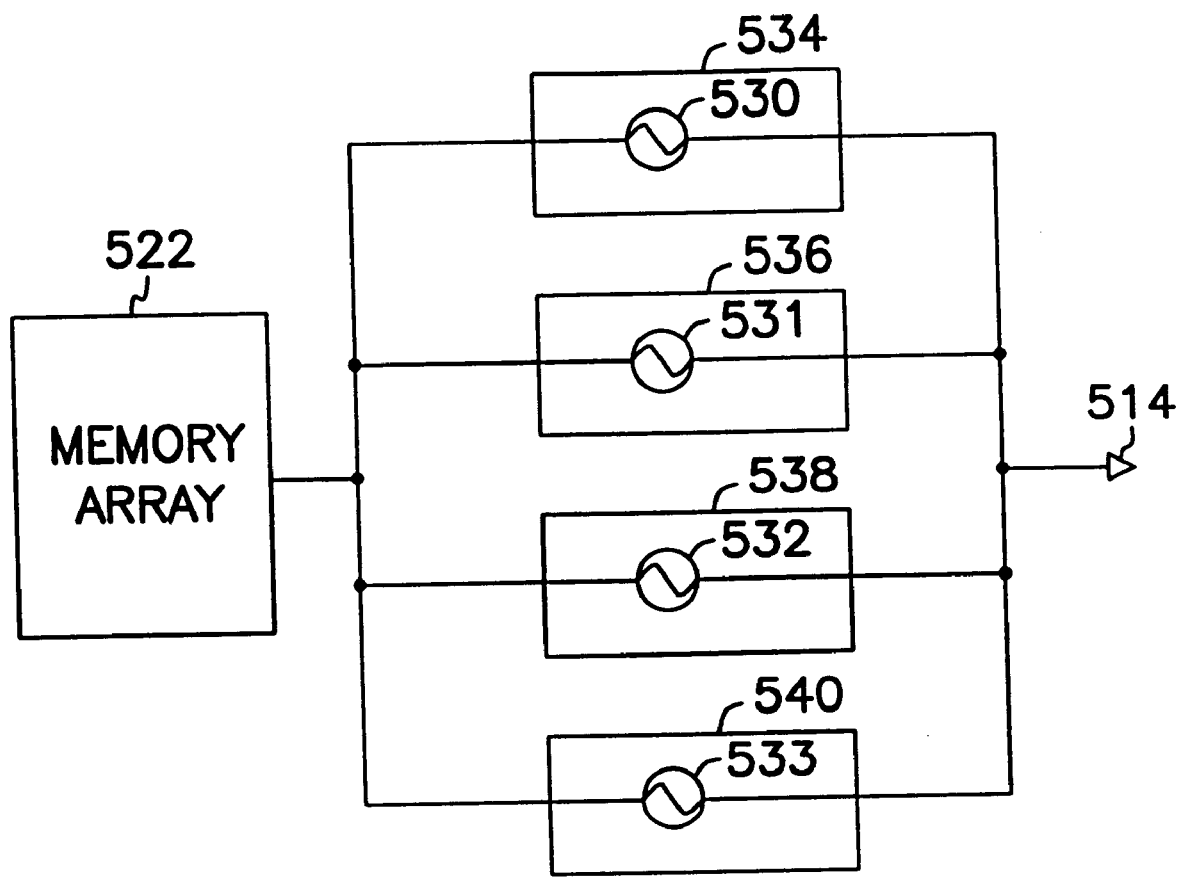
FIG. 5 is a block schematic representation of a chip manufactured with different and complete types of output logic circuitry, wherein the output logic of the chip is selected by programming an antifuse coupled to the desired output logic circuitry.

In a further embodiment, as shown in FIG. 5, a chip is manufactured having at least two complete output logic circuits and corresponding control circuitry, four combinations of which are represented generally as 534, 536, 538, and 540. Programmable fuses 530, 531, 532 and 533 are respectively coupled within logic control circuitry and corresponding output logic circuitry combination 534, 536, 538, 540 and memory array 522. To select the output logic for properly interfacing a chip, the antifuses 530, 531, 532 and 533 corresponding to the desired logic control circuitry and corresponding output logic circuitry combination 534, 536, 538, 540 are programmed to an "on" state by methods well known to one skilled in the art. Thus, the memory array 522 output through the output line 514 is electrically-coupled to one output logic circuit and corresponding output control logic circuitry combination 534, 536, 538, 540 and the output logic is compatible with the input logic of an adjacently-coupled chip. The chip may be manufactured with either fuses or antifuses controlling the switches.

The output logic circuits and corresponding output logic circuitry can be any such circuits as well known to one skilled in the art. For example, in FIG. 5, TTL logic is obtained using a TTL output logic circuit and corresponding output control logic circuitry 534. GTL-terminated logic is obtained using a GTL-terminated output logic circuit and corresponding output control logic circuitry 536. GTL-unterminated logic is obtained using a GTL-unterminated output logic circuit and corresponding output control logic circuitry 538. CTT-terminated output logic is obtained using a CTT-terminated output logic circuit and corresponding output control logic circuitry 540. HSTL-terminated, SSTL and LVTTL output logic can also be manufactured on a chip with fuse options according to the invention.

It is to be understood that the above description is intended to be illustrative, and not restrictive. For example, the memory arrays can be composed of another type of IC circuitry, corresponding to the type of chip in the invention, wherein the output logic interface of the chip is selected according to the invention. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A logic interface on a semiconductor chip for coupling an on-chip logic input signal to an off-chip output, comprising:

a fuse option coupled to the logic input signal; and a logic circuit including a pull-up transistor coupled to the output and to a supply voltage, the pull-up transistor having a gate coupled to the fuse option such that the supply voltage is totally disconnected from the output regardless of the state of the input signal when the fuse option is in a first state, and the supply voltage is connected to the output in response to the input signal when the fuse option is in a second state;

a pull-down transistor coupled to the output and to a reference potential, the pull-down transistor being permanently connected to input signal such that the reference potential is connected to the output in response to the input signal regardless of the state of the fuse option.

2. The logic interface of claim 1 where the logic circuit is selected from the group consisting of a transistor-transistor logic circuit, a low voltage transistor-transistor logic circuit, a gunning transceiver logic-unterminated circuit, a high speed transceiver logic-terminated circuit, a small swing transistor logic circuit, and a center-tapped-terminated logic circuit.

3. The chip interface of claim 1 where the fuse option includes a fuse that is conductive until blown, and thereafter becomes nonconductive.

4. The chip interface of claim 1, where the fuse option includes an antifuse that is nonconductive until blown, and thereafter becomes conductive.

5. The chip interface of claim 4, where the fuse is blown such that the logic interface corresponds to gunning transceiver logic-terminated circuit when the fuse option is in a nonconductive state.

6. A memory chip providing a selectable logic-family outputs to off-chip circuitry, the memory chip comprising:
   a memory array providing at least one data signal;
   a fuse option coupled to the data signal; and
   a logic circuit including
      a pull-up transistor coupled to one of the outputs and to a supply voltage, the pull-up transistor having a gate coupled to the fuse option such that the supply voltage is totally disconnected from the one output regardless of the state of the input signal when the fuse option is in a first state, and the supply voltage is connected to the one output in response to the input signal when the fuse option is in a second state;
      a pull-down transistor coupled to the one output and to a reference potential, the pull-down transistor being permanently connected to the input signal such that the reference potential is connected to the one output in response to the input signal regardless of the state of the fuse option.

7. The memory chip of claim 6 where the memory array provides multiple data signals, and further comprising:
   a plurality of further fuse options coupled to the multiple data signals; and
   a plurality of further logic circuits coupled to the fuse options and to the outputs.

8. The memory chip of claim 7 where the further logic circuits include
   pull-up transistors coupled to the outputs and to a supply voltage, the pull-up transistors having gates coupled to the fuse options such that the supply voltage is totally disconnected from the outputs regardless of the state of the data signals when the fuse options are in the first state, and the supply voltage is connected to the outputs in response to the data signals when the fuse options are in the second state;
   pull-down transistors coupled to the outputs and to a reference potential, the pull-down transistors being permanently connected to the data signals such that the reference potential is connected to the outputs in response to the input signal regardless of the state of the fuse options.

9. A method for selecting among different logic families for a chip interface, comprising:

fabricating a semiconductor chip with a logic circuit having an input coupled to receive an input signal from other integrated circuitry on the semiconductor chip, an output for coupling to circuitry off the chip, and a connection for potentially connecting the logic circuit to two different voltages;

placing a fuse option on the chip while fabricating the chip; and after fabricating the chip, blowing the fuse option so as to modify at least one connection of the logic circuit between
   a first configuration in which the logic circuit selectively connects the output to a first of the voltages in response to the input signal and selectively connects the output to a second of the voltages in response to the input signal, and
   a second configuration in which the logic circuit selectively connects the output to the first of the voltages in response to the input signal and permanently disconnects the output from the second of the voltages regardless of the input signal.

10. The method of claim 9 where the fuse option includes a fuse that is conductive until blown, and thereafter becomes nonconductive.

11. The method of claim 9 where the fuse option includes an antifuse that is nonconductive until blown, and thereafter becomes conductive.

12. The method of claim 9 where the one connection is modified such that the family of the chip interface corresponds to gunning transceiver logic-terminated.

13. The method of claim 9 where the logic family is selected from the group consisting of transistor-transistor logic, low voltage transistor-transistor logic, gunning transceiver logic-unterminated, high speed transceiver logic-terminated, small-swing transistor logic, and center-tapped-terminated logic.

14. A method for selecting among different logic families for a chip interface, comprising:
   fabricating a semiconductor chip with a logic circuit having an input coupled to receive an input signal from other integrated circuitry on the semiconductor chip, an output for coupling to circuitry off the chip, a plurality of pull-up transistors for potentially connecting the logic circuit to a supply voltage in response to the input, a plurality of pull-down transistors for potentially connecting the logic circuit to a reference voltage in response to the input signal, and at least one fuse option; and
   after fabricating the chip, blowing the fuse option so as to modify at least one connection of the logic circuit between
      a first configuration in which the logic circuit connects the output to the supply voltage through all of the pull-up transistors in response to the input, and to the reference voltage through all of the pull-down transistors in response to the input,
      a second configuration in which the logic circuit connects the output to the supply voltage through none of the pull-up transistors, and to the reference voltage through at least some of the pull-down transistors in response to the input.

15. The method of claim 14 where the first configuration converts the chip interface into a transistor-transistor logic interface family.

16. The method of claim 14 where the second configuration converts the chip interface into a gunning transceiver interface family.

17. The method of claim 14 where the second configuration connects the output to the reference voltage through all of the pull-down transistors in response to the input.

18. A method for selecting among different logic families for a chip interface, comprising:

fabricating a semiconductor chip with a logic circuit having an input coupled to receive an input signal from other integrated circuitry on the semiconductor chip, an output for coupling to circuitry off the chip, a plurality of pull-up transistors for potentially connecting the logic circuit to a supply voltage in response to the input, and a plurality of pull-down transistors for potentially connecting the logic circuit to a reference voltage in response to the input signal; and after fabricating the chip, modifying at least one connection of the logic circuit between a first configuration in which the logic circuit connects the output to the supply voltage through all of the pull-up transistors in response to the input, and to the reference voltage through all of the pull-down transistors in response to the input, a second configuration in which the logic circuit connects the output to the supply voltage through none of the pull-up transistors, and to the reference voltage through at least some of the pull-down transistors in response to the input, and a third configuration in which the logic circuit connects the output to the supply voltage through some but not all of the pull-up transistors in response to the input, and to some but not all of the pull-down transistors in response to the input.

19. The method of claim 18 where the third configuration converts the chip interface into a small-swing transistor logic interface family.

20. The method of claim 18 where the first configuration converts the chip interface into a transistor-transistor logic interface family.

21. The method of claim 18 where the second configuration converts the chip interface into a gunning transceiver interface family.

22. A chip interface for a semiconductor chip, comprising:

at least two logic circuits of mutually different families formed on the semiconductor chip and both coupled to the same input connection and to the same output connection; and at least two fuse options, each coupled to one of the logic circuits so as to enable only one of the logic circuits.

23. The chip interface of claim 22, where each logic circuit is selected from the group consisting of: a transistor-transistor logic circuit, a low voltage transistor-transistor logic circuit, a gunning transceiver logic-unterminated circuit, a gunning transceiver logic-terminated circuit, a gunning transceiver logic-unterminated circuit, a high speed transceiver logic-terminated circuit, a small swing transistor logic circuit, and a center-tapped-terminated logic circuit.

24. The chip interface of claim 22 where the fuse option includes a fuse that is conductive until blown, and thereafter becomes nonconductive.

25. The chip interface of claim 22 where the fuse option includes an antifuse that is nonconductive until blown, and thereafter becomes conductive.

26. A method for selecting a logic family for a chip interface, comprising:

fabricating a single semiconductor chip with at least two logic circuits of mutually different families coupled in parallel between an input signal connection and an output signal connection of integrated circuitry on the semiconductor chip, where the semiconductor chip has at least two fuse options coupled respectively between the integrated circuitry and each logic circuit; and programming the fuse options to connect one of the logic circuits between the input connection and the output connection, and to disconnect at least one other of the logic circuits.

27. The method of claim 26 where the logic circuits are selected from the group consisting of a transistor-transistor logic circuit, a low voltage transistor-transistor logic circuit, a gunning transceiver logic-unterminated circuit, a gunning transceiver logic-terminated circuit, a high speed transceiver logic-terminated circuit, a small swing transistor logic circuit and a center-tapped-terminated logic circuit.

28. The method of claim 26 where programming the fuse options comprises blowing at least one of them so as to transform it from a conductive to a nonconductive state.

29. The method of claim 26 where programming the fuse options comprises blowing at least one of them so as to transform it from a nonconductive to a conductive state.

* * * * *